US009575535B2

(12) United States Patent
Wang

(10) Patent No.: US 9,575,535 B2
(45) Date of Patent: Feb. 21, 2017

(54) INTEGRATED CIRCUIT AND OPERATION METHOD THEREOF

(71) Applicant: Nuvoton Technology Corporation, Hsinchu (TW)

(72) Inventor: Cheng-Chih Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 191 days.

(21) Appl. No.: 14/320,663

(22) Filed: Jul. 1, 2014

(65) Prior Publication Data

US 2015/0097607 A1    Apr. 9, 2015

(30) Foreign Application Priority Data

Oct. 9, 2013 (TW) .............................. 102136565 A

(51) Int. Cl.
| G06F 1/26 | (2006.01) |
| G06F 1/30 | (2006.01) |
| H03K 17/24 | (2006.01) |
| G06F 1/32 | (2006.01) |

(52) U.S. Cl.
CPC ............... G06F 1/305 (2013.01); H03K 17/24 (2013.01); *G06F 1/3203* (2013.01)

(58) Field of Classification Search
CPC ................................ G06F 1/305; H03K 17/24
USPC ........................................................ 713/300
See application file for complete search history.

(56) References Cited

U.S. PATENT DOCUMENTS

| 5,199,032 A * | 3/1993 | Sparks ................... G06F 11/004 713/321 |
| 5,428,748 A * | 6/1995 | Davidson .............. G06F 9/4411 710/9 |
| 5,606,511 A * | 2/1997 | Yach ...................... H02H 3/247 702/190 |
| 5,721,887 A * | 2/1998 | Nakajima ............... G06F 1/305 713/322 |
| 6,370,643 B1 * | 4/2002 | Kubo ........................ G06F 1/24 307/85 |
| 6,798,599 B2 | 9/2004 | Dykes et al. |
| 6,941,423 B2 | 9/2005 | Coulson |

(Continued)

FOREIGN PATENT DOCUMENTS

| CN | 1037633 C | 3/1998 |
| CN | 101478031 | 7/2009 |

(Continued)

OTHER PUBLICATIONS

"Office Action of Taiwan Counterpart Application", issued on Jul. 21, 2015, p. 1-p. 5.

*Primary Examiner* — Thomas Lee
*Assistant Examiner* — Volvick Derose
(74) *Attorney, Agent, or Firm* — Jiang Chyun IP Office

(57) ABSTRACT

An integrated circuit and an operation method thereof are provided. The integrated circuit includes a voltage detecting unit, a central processing unit, a memory unit and a control unit. The voltage detecting unit detects a system voltage and correspondingly outputs a voltage state signal. The central processing unit has at least one register. When the system voltage is downed to a voltage level lower than or equal to a brown-out voltage and greater than a reset low voltage, the control unit stores values of the registers into the memory unit.

19 Claims, 3 Drawing Sheets

(56) References Cited

U.S. PATENT DOCUMENTS

| | | | |
|---|---|---|---|
| 7,725,769 B1* | 5/2010 | Staab | G06F 1/30 |
| | | | 713/340 |
| 7,809,886 B2 | 10/2010 | Ashmore et al. | |
| 8,040,727 B1 | 10/2011 | Harari | |
| 8,081,504 B2 | 12/2011 | Chen et al. | |
| 8,113,437 B2 | 2/2012 | Kang | |
| 8,115,188 B2 | 2/2012 | Gosain et al. | |
| 8,270,226 B2 | 9/2012 | Choi et al. | |
| 8,296,496 B2 | 10/2012 | Mogul et al. | |
| 8,477,055 B2 | 7/2013 | Choi et al. | |
| 8,589,764 B2 | 11/2013 | Takeuchi et al. | |
| 8,635,511 B2 | 1/2014 | Takeuchi et al. | |
| 2002/0163368 A1* | 11/2002 | Cheung | G06F 1/24 |
| | | | 327/143 |
| 2003/0101362 A1 | 5/2003 | Dia | |
| 2006/0136766 A1* | 6/2006 | Kim | G06F 1/3203 |
| | | | 713/323 |
| 2009/0037755 A1* | 2/2009 | Nakano | G06F 1/3203 |
| | | | 713/322 |
| 2010/0241282 A1* | 9/2010 | Culshaw | G06F 11/00 |
| | | | 700/295 |
| 2011/0185212 A1* | 7/2011 | Dao | G01R 19/16519 |
| | | | 713/340 |
| 2012/0042200 A1 | 2/2012 | Takeuchi et al. | |
| 2012/0105108 A1* | 5/2012 | Vilas Boas | H03K 17/223 |
| | | | 327/78 |
| 2012/0303870 A1 | 11/2012 | Park et al. | |
| 2013/0027079 A1 | 1/2013 | Nazarian et al. | |
| 2013/0027081 A1 | 1/2013 | Nazarian et al. | |
| 2014/0313840 A1* | 10/2014 | Hwang | G11C 29/785 |
| | | | 365/200 |
| 2015/0025821 A1* | 1/2015 | Kim | G11B 19/047 |
| | | | 702/60 |

FOREIGN PATENT DOCUMENTS

| | | |
|---|---|---|
| CN | 102169719 | 8/2011 |
| CN | 102412827 | 4/2012 |
| KR | 101031420 | 4/2011 |
| KR | 20110057839 | 6/2011 |
| TW | I313801 | 8/2009 |

* cited by examiner

INTEGRATED CIRCUIT AND OPERATION METHOD THEREOF

CROSS-REFERENCE TO RELATED APPLICATION

This application claims the priority benefit of Taiwan application serial no. 102136565, filed on Oct. 9, 2013. The entirety of the above-mentioned patent application is hereby incorporated by reference herein and made a part of this specification.

BACKGROUND OF THE INVENTION

Field of the Invention

The embodiments of present invention relate to an integrated circuit and an operation method thereof.

Description of Related Art

As performance of a micro-controller gradually improved with advancement of semiconductor technologies, the micro-controller has been widely applied in many fields including electrical machine controls, barcode readers/scanners, consumer electronics, game machines, phones, air conditioners, security and access control for buildings, industrial controls and automations, and appliances (e.g., washing machines or microwave ovens).

In case the micro-controller is applied in a large scale system (e.g., the industrial controls), stability and safety of the micro-controller are especially emphasized. However, when a system voltage received by the micro-controller suddenly disappears, the micro-controller will enter a reset state and data stored in the micro-controller will lose. When the micro-controller receives the system voltage again, the micro-controller is resumed back to an operating state. Nevertheless, since the data stored in the micro-controller is lost, the micro-controller may not be able to resume to previous operations after entering the operating state. Accordingly, the micro-controller may not be able to provide related functions, that is, the stability and safety of the micro-controller are influenced by sudden power outage.

SUMMARY OF THE INVENTION

The integrated circuit according to the one embodiment of the invention includes a voltage detecting unit, a central processing unit, a memory unit, and a control unit. The voltage detecting unit is configured to detect a system voltage and correspondingly output a voltage state signal. The central processing unit having at least one register, is coupled to the voltage detecting unit for receiving the system voltage and is configured to determine whether to start operating according to the voltage state signal. The control unit is coupled to the voltage detecting unit, the central processing unit and the memory unit, and configured to receive the voltage state signal and the system voltage. When the system voltage is downed to a voltage lower than or equal to a brown-out voltage and greater than a reset low voltage, the central processing unit enters an idle state and the control unit stores values of the at least one register into the memory unit.

The operation method of the integrated circuit according to one embodiment of the invention includes the following steps. Determining whether a system voltage provided to a central processing unit is downed to or upped to a voltage level greater than a reset low voltage and lower than or equal to a brown-out voltage. Storing a part or all of values of the at least one register of the central processing unit into a memory unit when the system voltage is downed to the voltage level lower than or equal to the brown-out voltage and greater than the reset low voltage. Writing the part or all of the values of the at least one register stored in the memory unit into the at least one register when the system voltage is upped to the voltage level greater than the reset low voltage and lower than or equal to the brown-out voltage.

The operation method of the integrated circuit according to one embodiment of the invention includes the following steps. Whether a central processing unit is in an idle state is determined. Determining whether a central processing unit is in an idle state. determining whether a system voltage provided to the central processing unit is downed to or upped to a voltage level greater than a reset low voltage and lower than or equal to a brown-out voltage when the central processing unit is in the idle state. Storing values of a plurality of registers of the central processing unit into a memory unit when the system voltage is downed to the voltage level lower than or equal to the brown-out voltage and greater than the reset low voltage. Writing the values of the registers stored in the memory unit into the registers when the system voltage is upped to the voltage level greater than the reset low voltage and lower than or equal to the brown-out voltage and a pre-read operation is executed.

To make the above features and advantages of the disclosure more comprehensible, several embodiments accompanied with drawings are described in detail as follows.

DESCRIPTION OF THE EMBODIMENTS

Figure 1:
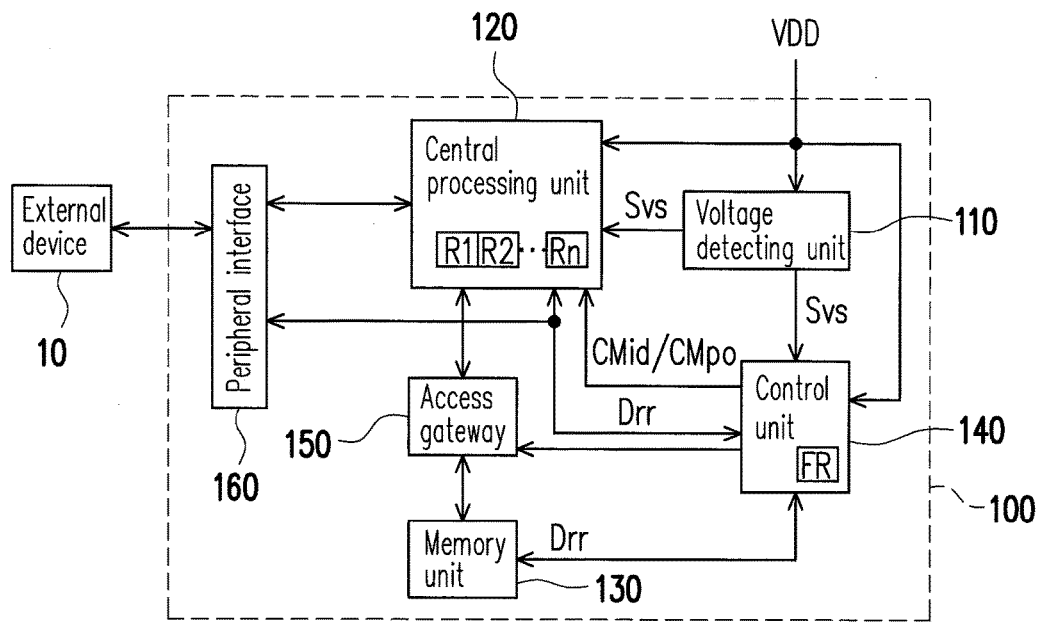
FIG. 1 is a schematic system diagram of an integrated circuit according to an embodiment of the invention.

FIG. 1 is a schematic system diagram of an integrated circuit according to an embodiment of the invention, and the integrated circuit may be a micro-controller circuit. Referring to FIG. 1, in the present embodiment, an integrated circuit 100 includes a voltage detecting unit 110, a central processing unit 120, a memory unit 130, a control unit 140, an access gateway 150 and a peripheral interface 160. Therein, the memory unit 130 may be a non-volatile memory (NVRAM), this may be selectively used by persons skilled in the art. The central processing unit 120 may be, for example, a micro controller, a microprocessor or other processing units.

The voltage detecting unit 110 may receive a system voltage VDD (e.g., 5V, 3.3V or 1.8V) required for operating the integrated circuit 100 to detect whether the system voltage VDD is greater than a reset low voltage Vlvr or a brown-out voltage Vbo, so as to correspondingly output a voltage state signal Svs. The voltage state signal Svs may be a digital signal or an analog signal, and the reset low voltage Vlvr may be lower than the brown-out voltage Vbo. In the present embodiment, the brown-out voltage Vbo may indicate that the system voltage VDD is in a stable voltage level, and the reset low voltage Vlvr may indicate a minimum voltage level required for the integrated circuit 100 to operate normally. Generally, the brown-out voltage Vbo may fall between 2.7V to 4V, and the reset low voltage Vlvr may fall between 1.2V to 1.4V. However, above said ranges of the voltage may be set different based on actual applications.

The central processing unit 120 may include a plurality of registers (e.g., R1~Rn, and n is a positive integer) and receive the system voltage VDD. Therein, the registers R1~Rn include a register file and a control register, and the control register is, for example, a program counter, a general purpose timer, a general purpose counter, a peripheral control register, a peripheral status register and etc. Further, data stored in the registers can be data required for operating the CPU, such as a brown-out reset level, an operating clock frequency or a non-volatile memory map allocation.

The central processing unit 120 is coupled to the voltage detecting unit 110 to receive the voltage state signal Svs, and the central processing unit 120 may determine whether the system voltage VDD is ready according to the voltage state signal Svs (e.g., when the system voltage VDD is greater than the brown-out voltage Vbo, it is determined that the system voltage VDD is ready). When the system voltage VDD is not ready, the central processing unit 120 may enter a reset state or an idle state (i.e., it is not yet to start operating) so as to avoid errors occurred in executions. When the system voltage VDD is ready, the central processing unit 120 may start operating. In other words, whether to start operating the central processing unit 120 may be determined according to the voltage state signal Svs. The idle state may be similar to state S2 or S3 defined in ACPI standard. Under such state, the central processing unit 120 is not operating and a clock is still running. The power-off state may be similar to state S4 or S5 defined in ACPI standard. In this power-off state, the clock and the central processing unit 120 are not running, and electronic circuits (e.g., the voltage detecting unit 110, the control unit 140 and etc.) included in the integrated circuit are still connected to a power supply. In the reset state, besides that the central processing unit 120 and the clock are not running, the data in the register may further be reset.

The control unit 140 is coupled to the voltage detecting unit 110, the central processing unit 120 and the memory unit 130, and capable of receiving the voltage state signal Svs and the system voltage VDD. When the received voltage state signal Svs informs that the system voltage VDD is downed to a voltage level lower than or equal to the brown-out voltage Vbo and greater than the reset low voltage Vlvr, the control unit 140 may control the central processing unit 120 to enter the idle state, such that values of the registers R1~Rn may remain unchanged. Furthermore, the control unit 140 may provide a force idle command CMid to the central processing unit 120 to control the central processing unit 120 to enter the idle state. Next, the control unit 140 may read values Drr of the registers R1~Rn, and the control unit 140 may store the values Drr of the registers R1~Rn into the memory unit 130. When the control unit 140 completely writes the values Drr of the registers R1~Rn into the memory unit 130, the control unit 140 may provide a power-off command CMpo to the central processing unit 120 to control the central processing unit 120, so that the central processing unit 120 is controlled to enter a power-off state. In other embodiments, based on actual applications, only a part of the values Drr of the registers R1~Rn is stored into the memory unit 130. Except to that the control unit 140 may control the central processing unit 120 to enter the idle state, in another embodiment, when the received voltage state signal Svs informs that the system voltage VDD is downed to the voltage level lower than or equal to the brown-out voltage Vbo and greater than the reset low voltage Vlvr, the central processing unit 120 may also enter the idle state automatically.

When the system voltage VDD is upped to a voltage level greater than the reset low voltage Vlvr and a pre-read operation is executed by the control unit 140, the control unit 140 can read the values Drr of the registers R1~Rn stored in the memory unit 130, and writes the read values Drr back into the registers R1~Rn. Therein, when the control unit 140 executes the pre-read operation, the control unit 140 may read an option bit defined by a user, so as to determine operating parameters (e.g., the reset low voltage Vlvr, the brown-out voltage Vbo) for the control unit 140.

In other embodiments, the central processing unit 120 may automatically enters the idle mode after detecting that the voltage is recovered back to, for example, back to the voltage level greater than the reset low voltage Vlvr, and may automatically enter an operating mode when detecting that the voltage is recovered back to a voltage level greater than the brown-out voltage Vbo. In other embodiments, a time required for the voltage to be upped from the reset low voltage Vlvr to the brown-out voltage Vbo and a time requi0red for restoring the data of the registers R1~Rn may both be estimated, so as to determine when the data of registers R1~Rn should be restored by the control unit 140. For instance, the control unit 140 may be set to completely restore the data (e.g., the values Drr) of the registers R1~Rn at the moment before central processing unit 120 enters the operating mode.

Based on above, when power is out (e.g., the system voltage VDD is downed to the voltage level lower than or equal to the brown-out voltage Vbo), the control unit 140 may store the values Drr of the registers R1~Rn into the memory unit 130. Thereafter, when power is back (e.g., the system voltage VDD is upped to the voltage level greater than the reset low voltage Vlvr), the control unit 140 may write the values Drr of the registers R1~Rn stored in the memory unit 130 back to the registers R1~Rn. Since the values of the registers R1~Rn remain the same before and after the power is out (i.e., an operating state of the integrated circuit 100 remains unchanged), the integrated circuit 100 is not subject to influences of power outage, such that the stability and safety of the integrated circuit 100 may be improved.

The access gateway 150 may be coupled to the central processing unit 120, the memory unit 130 and the control unit 140. When the system voltage VDD is upped to the voltage level greater than the brown-out voltage Vbo, the control unit 140 may turn on the access gateway 150 for the central processing unit 120 to access the memory unit 130. When the system voltage VDD is downed to the voltage level lower than or equal to the brown-out voltage Vbo, the control unit 140 may cut off the access gateway 150, so that the central processing unit 120 does not continue to read the data from the memory 130. In other embodiment, it is also possible that the access gateway 150 is not cut off. Since the central processing unit 120 is not operating in the idle state, it is not required for the central processing unit 120 to read the data in the memory unit 130 in the idle state.

The peripheral interface 160 is coupled to an external device 10 and the central processing unit 120, and configured to couple the central processing unit 120 to the external device 10 through the peripheral interface 160. The external device 10 may receive the data or the values Drr of the registers R1~Rn provided by the central processing unit 120 through the peripheral interface 160.

In an embodiment of the invention, the control unit 140 may integrate a joint test action group (JTAG) and/or an in-circuit emulator (ICE). Furthermore, the control unit 140 may equip a resume flag FR. When the control unit 140 completely stores the values Drr of the registers R1~Rn into the memory unit 130, the control unit 140 may set the resume flag FR, so as to indicate that the memory unit 130 has completely backed up the values Drr of the registers R1~Rn. In addition, when the control unit 140 completely rewrite the values Drr of the registers R1~Rn stored in the memory unit 130 into the registers R1~Rn, the control unit 140 may reset the resume flag FR, so as to indicate that the values Drr of the registers R1~Rn backed up in the memory unit 130 are overdue and not be used. The control unit 140 may verify the resume flag FR when executing the pre-read operation. Detailed description regarding the resume flag FR may refer to the following embodiments.

Figure 2:
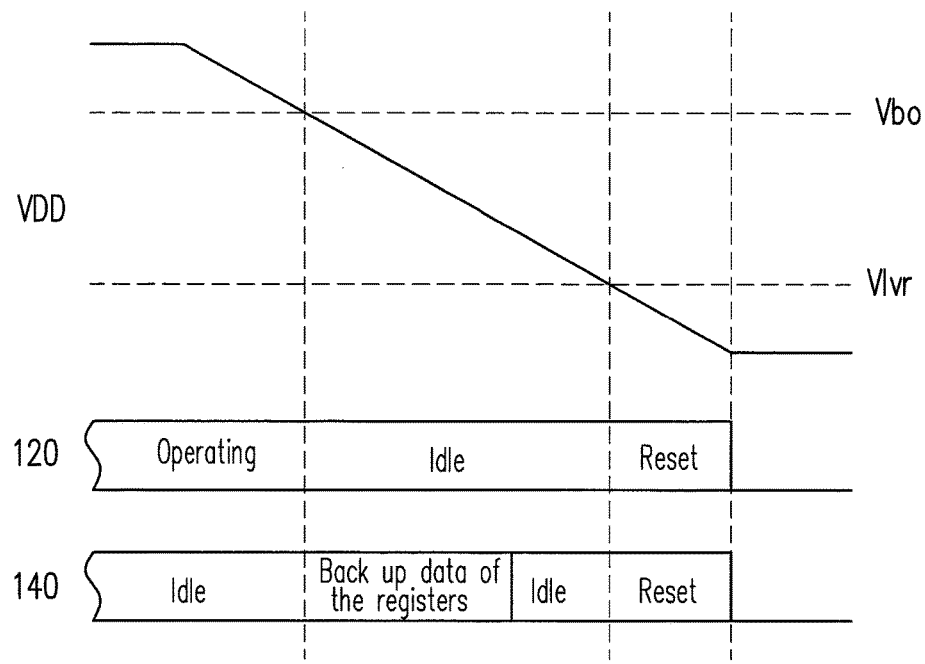
FIG. 2 is a schematic diagram illustrating operations of the central processing unit and the control unit as depicted in FIG. 1 when power is out according to an embodiment of the invention.

FIG. 2 is a schematic diagram illustrating operations of the central processing unit and the control unit as depicted in FIG. 1 when power is out according to an embodiment of the invention. Referring to FIG. 1 and FIG. 2, in the present embodiment, when the system voltage VDD is greater than the brown-out voltage Vbo, the central processing unit 120 may enter the operating state, and the control unit 140 may enter the idle state.

When the system voltage VDD is downed to the voltage level lower than or equal to the brown-out voltage Vbo and greater than the reset low voltage Vlvr, the control unit 140 may provide the force idle command CMid to the central processing unit 120 to control the central processing unit 120 to enter the idle state. Next, the control unit 140 may read values Drr of the registers R1~Rn, and store the values Drr of the registers R1~Rn into the memory unit 130. Namely, the control unit 140 may back up the data of the registers R1~Rn. After the values Drr of the registers R1~Rn are stored into the memory unit 130 by the control unit 140, the control unit 140 may enter the idle state. Furthermore, the control unit 140 may set the resume flag FR before the control unit 140 entering the idle state. When the system voltage VDD is downed to a voltage level lower than or equal to the reset low voltage Vlvr, the central processing unit 120 and the control unit 140 are switched to enter the reset state.

Figure 3:
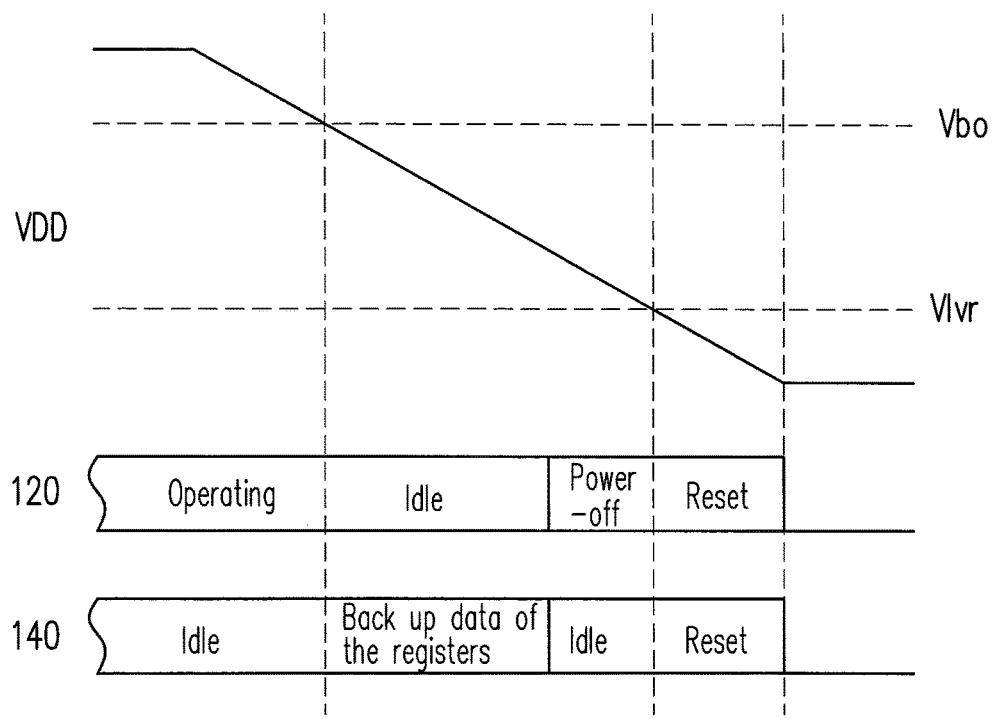
FIG. 3 is a schematic diagram illustrating operations of the central processing unit and the control unit as depicted in FIG. 1 when power is out according to another embodiment of the invention.

FIG. 3 is a schematic diagram illustrating operations of the central processing unit and the control unit as depicted in FIG. 1 when power is out according to another embodiment of the invention. Referring to FIG. 1 to FIG. 3, operations in the present embodiment are substantially identical to the that of FIG. 2, a difference thereof is that, after the values Drr of the registers R1~Rn are stored into the memory unit 130 by the control unit 140, the control unit 140 may provide the power-off command CMpo to the central processing unit 120 to control the central processing unit 120 to enter the power-off state.

Figure 4:
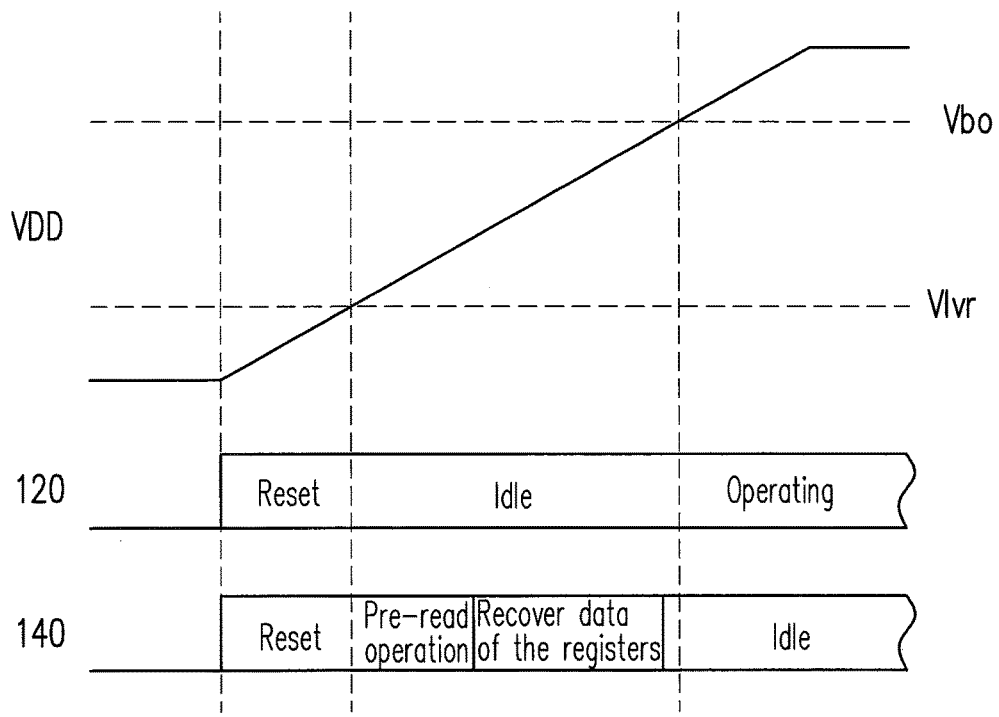
FIG. 4 is a schematic diagram illustrating operations of the central processing unit and the control unit as depicted in FIG. 1 when power is back according to an embodiment of the invention.

FIG. 4 is a schematic diagram illustrating operations of the central processing unit and the control unit as depicted in FIG. 1 when power is back according to an embodiment of the invention. Referring to FIG. 1 and FIG. 4, in the present embodiment, when the system voltage VDD is lower than or equal to the reset low voltage Vlvr, the central processing unit 120 and the control unit 140 may enter the reset state.

When the system voltage VDD is upped to the voltage level greater than the reset low voltage Vlvr and lower than or equal to the brown-out voltage Vbo, the central processing unit 120 may enter the idle state, and the control unit 140 may execute the pre-read operation to read the option bit defined by the user, and reads the resume flag FR. When the pre-read operation is executed by the control unit 140, the control unit 140 may read the values Drr of the registers R1~Rn stored in the memory unit 130, and rewrite the read values Drr into the registers R1~Rn. Namely, the control unit 140 may restore the data of the registers R1~Rn. When the values Drr of the registers R1~Rn are rewritten into the registers R1~Rn by the control unit 140, the control unit 140 may reset the resume flag FR and then enter the idle state. When the system voltage VDD is upped to a voltage greater than the brown-out voltage Vbo, the central processing unit 120 enters the operating state (i.e., it starts operating).

Accordingly, in order to completely back up the values Drr of the registers R1~Rn, a time required for the control unit 140 to read the values Drr of the registers R1~Rn and completely store the values Drr of the registers R1~Rn into the memory unit 130 may be less than or equal to a time for the system voltage VDD to be downed from the brown-out voltage Vbo to the reset low voltage Vlvr. Generally, the time required for the system voltage VDD to be downed from the brown-out voltage Vbo to the reset low voltage Vlvr may be different based on actual conditions and approximately ranges from 1 μs to 100 ms. Furthermore, in the present embodiment, a minimum operating voltage of the memory unit 130 may be the reset low voltage Vlvr. Accordingly, before the system voltage VDD is downed to the reset low voltage Vlvr, the values Drr of the registers R1~Rn may be normally written into the memory unit 130. Therein, the reading time for the values Drr of the registers R1~Rn may be reduced and the values Drr of the registers R1~Rn may be successfully written by selectively using a memory device having a high writing speed and capable of normally programming under low voltage (e.g., operating under 2.5V or even 0.8V), such as a resistance random access memory (RRAM) or other non-volatile memories capable of writing the data under low voltage. In other words, the values Drr of the registers R1~Rn may be stored into the memory unit 130 without adding extra batteries.

Figure 5:
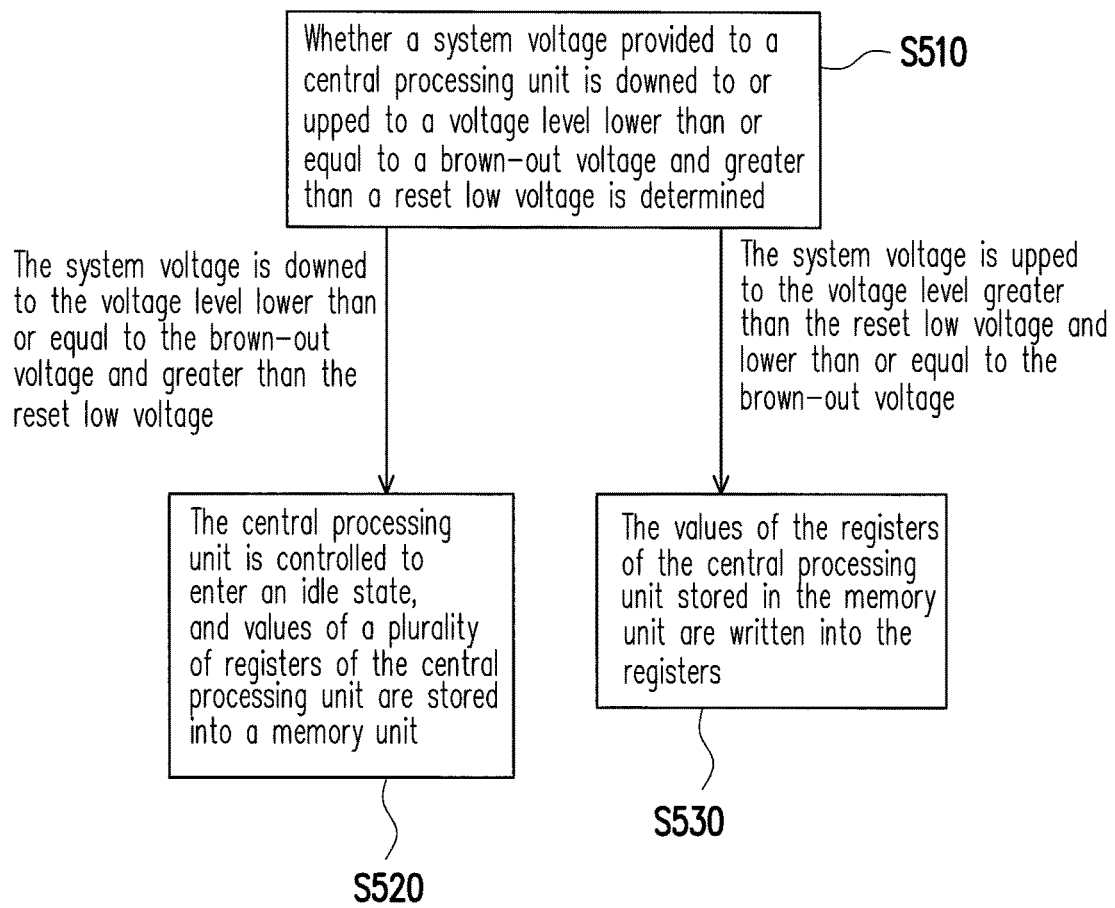
FIG. 5 is a flowchart of an operation method of an integrated circuit according to an embodiment of the invention.

FIG. 5 is a flowchart of an operation method of an integrated circuit according to an embodiment of the invention. Referring to FIG. 5, in the present embodiment, the operation method of the integrated circuit includes the following steps. Whether a system voltage provided to a central processing unit is downed to or upped to a voltage level lower than or equal to a brown-out voltage and greater than a reset low voltage is determined (step S510). When the system voltage is downed to the voltage level lower than or equal to the brown-out voltage and greater than the reset low voltage, the central processing unit is controlled to enter an idle state, and values of registers of the central processing unit are stored into a memory unit (step S520). When the system voltage is upped to the voltage level greater than the reset low voltage and lower than or equal to the brown-out voltage, the values of the registers of the central processing unit stored in the memory unit are written into the registers (step S530). Among them, a sequence of steps S510, S520 and S530 is merely an example, the embodiments of the invention are not limited thereto. Further, details regarding steps S510, S520 and S530 may refer to the embodiments as illustrated in FIG. 1 to FIG. 4, thus related description is omitted hereinafter.

Based on above, in the integrated circuit and the operation method thereof, when the system voltage is downed to the voltage level lower than or equal to a brown-out voltage and greater than a reset low voltage, the control unit stores the values of the registers into the memory unit, and when the system voltage is upped to the voltage level greater than the reset low voltage and lower than or equal to the brown-out voltage, the control unit writes the values of the registers stored in the memory unit back to the registers. Accordingly, the integrated circuit is not subject to influences of power outage, such that the stability and safety of the integrated circuit may be improved. Moreover, a probability for completely backing up the values of the registers may be increased without adding extra batteries by selectively using the memory device having a high writing speed and capable of programming under low voltage.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An integrated circuit, comprising:
  a voltage detecting unit configured to detect a system voltage and correspondingly output a voltage state signal;
  a central processing unit having at least one register, coupled to the voltage detecting unit for receiving the system voltage, and configured to determine whether to start operating according to the voltage state signal;
  a memory unit; and
  a control unit coupled to the voltage detecting unit, the central processing unit and the memory unit, and configured to receive the voltage state signal and the system voltage, and when the system voltage is downed to a voltage level lower than or equal to a brown-out voltage and greater than a reset low voltage, the central processing unit entering an idle state and the control unit storing values of the at least one register into the memory unit,
  wherein, during the idle state, the control unit reads the values of the at least one register stored in the memory unit and writes the reading values of the at least one register into the at least one register when the system voltage is upped to the voltage level greater than the reset low voltage and lower than or equal to the brown-out voltage.

2. The integrated circuit of claim 1, wherein the control unit provides a force idle command to the central processing unit to control the central processing unit to enter the idle state when the system voltage is downed to the voltage level lower than or equal to the brown-out voltage and greater than the reset low voltage.

3. The integrated circuit of claim 1, wherein the control unit provides a power-off command to the central processing unit to control the central processing unit to enter a power-off state when the control unit completely stores the values of the at least one register into the memory unit.

4. The integrated circuit of claim 1, wherein the central processing unit is switched to enter a reset state when the system voltage is downed to the voltage level lower than or equal to the reset low voltage.

5. The integrated circuit of claim 1, wherein the control unit sets a resume flag when the control unit completely stores the values of the at least one register into the memory unit, and the control unit resets the resume flag when the control unit completely rewrites the values of the at least one register stored in the memory unit into the at least one register.

6. The integrated circuit of claim 1, wherein the control unit reads the values of the at least one register stored in the memory unit and writes the values into the at least one register when a pre-read operation is executed by the control unit and the system voltage is upped to the voltage level greater than the reset low voltage and lower than or equal to the brown-out voltage ,and
  wherein, the central processing unit starts operating when the system voltage is upped to the voltage level greater than the brown-out voltage.

7. The integrated circuit of claim 1, wherein a time required for the control unit to read the values of the at least one register and completely store the values of the at least one register into the memory unit is less than or equal to a time for the system voltage to be downed from the brown-out voltage to the reset low voltage.

8. The integrated circuit of claim 1, wherein a minimum operating voltage of the memory unit is equal to the reset low voltage.

9. The integrated circuit of claim 1, further comprising:
  an access gateway coupled to the central processing unit, the memory unit and the control unit, the control unit turning on the access gateway for the central processing unit to access the memory unit when the system voltage is upped to the voltage level greater than the brown-out voltage, and the control unit cutting off the access gateway when the system voltage is downed to the voltage level lower than and equal to the brown-out voltage.

10. The integrated circuit of claim 1, further comprising a joint test action group (JTAG) and/or an in-circuit emulator (ICE), wherein the control unit integrates the joint test action group and/or the in-circuit emulator.

11. An operation method of an integrated circuit, comprising:
  determining whether a system voltage provided to a central processing unit is downed to or upped to a voltage level greater than a reset low voltage and lower than or equal to a brown-out voltage;
  storing a part or all of values of the at least one register of the central processing unit into a memory unit and then entering an idle state when the system voltage is downed to the voltage level lower than or equal to the brown-out voltage and greater than the reset low voltage; and
  writing the part or all of the values of the at least one register stored in the memory unit into the at least one register when the system voltage is upped to the voltage level greater than the reset low voltage and lower than or equal to the brown-out voltage.

12. The operation method of the integrated circuit of claim 11, further comprising:
  providing a force idle command to the central processing unit to control the central processing unit to enter the idle state when the system voltage is downed to the voltage level lower than or equal to the brown-out voltage and greater than the reset low voltage.

13. The operation method of the integrated circuit of claim 11, further comprising:

controlling the central processing unit o enter a power-off state when the values of the at least one register are completely stored into the memory unit.

14. The operation method of the integrated circuit of claim 13, further comprising:
switching the central processing unit to enter a reset state when the system voltage is downed to the voltage level lower than or equal to the reset low voltage.

15. The operation method of the integrated circuit of claim 11, further comprising:
setting a resume flag when the control unit completely stores the values of the at least one register into the memory unit; and
resetting the resume flag when the control unit completely rewrites the values of the at least one register stored in the memory unit into the at least one register.

16. The operation method of the integrated circuit of claim 11, further comprising:
writing the values of the at least one register stored in the memory unit into the at least one register when a pre-read operation being executed and the system voltage is upped to the voltage level greater than the reset low voltage and lower than or equal to the brown-out voltage ; and
starting operating the central processing unit when the system voltage is upped to the voltage level greater than the brown-out voltage.

17. The operation method of the integrated circuit of claim 11, wherein a time required for reading the values of the at least one register and completely storing the values of the at least one register into the memory unit is less than or equal to a time for the system voltage to be downed from the brown-out voltage to the reset low voltage.

18. The operation method of the integrated circuit of claim 11, wherein a minimum operating voltage of the memory unit is equal to the reset low voltage.

19. An operation method of an integrated circuit, comprising:
determining whether a central processing unit is in an idle state;
determining whether a system voltage provided to the central processing unit is downed to or upped to a voltage level greater than a reset low voltage and lower than or equal to a brown-out voltage when the central processing unit is in the idle state;
storing values of a plurality of registers of the central processing unit into a memory unit when the system voltage is downed to the voltage level lower than or equal to the brown-out voltage and greater than the reset low voltage; and
during the idle state, writing the values of the registers stored in the memory unit into the registers when the system voltage is upped to the voltage level greater than the reset low voltage and lower than or equal to the brown-out voltage and a pre-read operation is executed.

* * * * *